(12) United States Patent
Danner et al.

(10) Patent No.: US 7,688,497 B2
(45) Date of Patent: Mar. 30, 2010

(54) MULTI-LAYER SHEET FOR USE IN ELECTRO-OPTIC DISPLAYS

(75) Inventors: Guy M. Danner, Somerville, MA (US); Matthew Joseph Kayal, Franklin, MA (US); Henry Ware Gale, Westwood, MA (US)

(73) Assignee: E Ink Corporation, Cambridge, MA (US)

( * ) Notice: Subject to any disclaimer, the term of this patent is extended or adjusted under 35 U.S.C. 154(b) by 70 days.

(21) Appl. No.: 12/112,693

(22) Filed: Apr. 30, 2008

(65) Prior Publication Data

US 2008/0254272 A1    Oct. 16, 2008

Related U.S. Application Data

(63) Continuation-in-part of application No. 12/017,586, filed on Jan. 22, 2008.

(60) Provisional application No. 60/886,005, filed on Jan. 22, 2007.

(51) Int. Cl.
*G02B 26/00* (2006.01)
*G09G 3/38* (2006.01)
*H01L 51/40* (2006.01)
*G02F 1/1333* (2006.01)

(52) U.S. Cl. .................. 359/296; 345/105; 438/20; 349/84

(58) Field of Classification Search .......... 359/245, 359/247, 252–253, 265–275, 296; 345/49–50, 345/105, 107; 349/84, 153–154, 189–190; 438/29
See application file for complete search history.

(56) References Cited

U.S. PATENT DOCUMENTS 3,668,106 A    6/1972    Ota (Continued)

FOREIGN PATENT DOCUMENTS

EP    1 099 207 B1    3/2002

(Continued)

OTHER PUBLICATIONS

Amundson, K., "Electrophoretic Imaging Films for Electronic Paper Displays" in Crawford, G. ed. Flexible Flat Panel Displays, John Wiley & Sons, Ltd., Hoboken, NJ: 2005.

(Continued)

*Primary Examiner*—Scott J Sugarman
*Assistant Examiner*—Dawayne A Pinkney
(74) *Attorney, Agent, or Firm*—David J. Cole

(57) ABSTRACT

A multi-layer film (300), useful as a barrier film in electro-optic displays, comprises a light-transmissive adhesive layer (316), a light-transmissive first protective layer (312), a light-transmissive first moisture barrier layer (308B), an intermediate layer (typically an adhesive layer) (310), a light-transmissive second moisture barrier layer (308A) and a light-transmissive second protective layer (306). The second protective layer may be covered by a hard coat (304) and/or a masking film (302).

19 Claims, 4 Drawing Sheets

U.S. PATENT DOCUMENTS

| | | |
|---|---|---|
| 3,756,693 A | 9/1973 | Ota |
| 3,767,392 A | 10/1973 | Ota |
| 3,792,308 A | 2/1974 | Ota |
| 3,870,517 A | 3/1975 | Ota et al. |
| 3,892,568 A | 7/1975 | Ota |
| 4,418,346 A | 11/1983 | Batchelder |
| 4,640,583 A | 2/1987 | Hoshikawa et al. |
| 4,857,393 A | 8/1989 | Kato et al. |
| 5,589,252 A | 12/1996 | Matsuo et al. |
| 5,645,923 A | 7/1997 | Matsuo et al. |
| 5,745,094 A | 4/1998 | Gordon, II et al. |
| 5,760,761 A | 6/1998 | Sheridon |
| 5,777,782 A | 7/1998 | Sheridon |
| 5,808,783 A | 9/1998 | Crowley |
| 5,872,552 A | 2/1999 | Gordon, II et al. |
| 5,930,026 A | 7/1999 | Jacobson et al. |
| 5,961,804 A | 10/1999 | Jacobson et al. |
| 6,017,584 A | 1/2000 | Albert et al. |
| 6,054,071 A | 4/2000 | Mikkelsen, Jr. |
| 6,055,091 A | 4/2000 | Sheridon et al. |
| 6,067,185 A | 5/2000 | Albert et al. |
| 6,097,531 A | 8/2000 | Sheridon |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,172,798 B1 | 1/2001 | Albert et al. |
| 6,177,921 B1 | 1/2001 | Comiskey et al. |
| 6,184,856 B1 | 2/2001 | Gordon, II et al. |
| 6,225,971 B1 | 5/2001 | Gordon, II et al. |
| 6,232,950 B1 | 5/2001 | Albert et al. |
| 6,241,921 B1 | 6/2001 | Jacobson et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,271,823 B1 | 8/2001 | Gordon, II et al. |
| 6,300,932 B1 | 10/2001 | Albert |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,323,989 B1 | 11/2001 | Jacobson et al. |
| 6,327,072 B1 | 12/2001 | Comiskey et al. |
| 6,376,828 B1 | 4/2002 | Comiskey |
| 6,377,387 B1 | 4/2002 | Duthaler et al. |
| 6,392,785 B1 | 5/2002 | Albert et al. |
| 6,392,786 B1 | 5/2002 | Albert |
| 6,413,790 B1 | 7/2002 | Duthaler et al. |
| 6,422,687 B1 | 7/2002 | Jacobson |
| 6,445,374 B2 | 9/2002 | Albert et al. |
| 6,445,489 B1 | 9/2002 | Jacobson et al. |
| 6,459,418 B1 | 10/2002 | Comiskey et al. |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,515,649 B1 | 2/2003 | Albert et al. |
| 6,518,949 B2 | 2/2003 | Drzaic |
| 6,521,489 B2 | 2/2003 | Duthaler et al. |
| 6,531,997 B1 | 3/2003 | Gates et al. |
| 6,535,197 B1 | 3/2003 | Comiskey et al. |
| 6,538,801 B2 | 3/2003 | Jacobson et al. |
| 6,545,291 B1 | 4/2003 | Amundson et al. |
| 6,580,545 B2 | 6/2003 | Morrison et al. |
| 6,639,578 B1 | 10/2003 | Comiskey et al. |
| 6,652,075 B2 | 11/2003 | Jacobson |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,693,620 B1 | 2/2004 | Herb et al. |
| 6,704,133 B2 | 3/2004 | Gates et al. |
| 6,710,540 B1 | 3/2004 | Albert et al. |
| 6,721,083 B2 | 4/2004 | Jacobson et al. |
| 6,724,519 B1 | 4/2004 | Comiskey et al. |
| 6,727,881 B1 | 4/2004 | Albert et al. |
| 6,738,050 B2 | 5/2004 | Comiskey et al. |
| 6,750,473 B2 | 6/2004 | Amundson et al. |
| 6,753,999 B2 | 6/2004 | Zehner et al. |
| 6,788,449 B2 | 9/2004 | Liang et al. |
| 6,816,147 B2 | 11/2004 | Albert |
| 6,819,471 B2 | 11/2004 | Amundson et al. |
| 6,822,782 B2 | 11/2004 | Honeyman et al. |
| 6,825,068 B2 | 11/2004 | Denis et al. |
| 6,825,829 B1 | 11/2004 | Albert et al. |
| 6,825,970 B2 | 11/2004 | Goenaga et al. |
| 6,831,769 B2 | 12/2004 | Holman et al. |
| 6,839,158 B2 | 1/2005 | Albert et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,864,875 B2 | 3/2005 | Drzaic et a. |
| 6,865,010 B2 | 3/2005 | Duthaler et al. |
| 6,866,760 B2 | 3/2005 | Paolini Jr. et al. |
| 6,870,657 B1 | 3/2005 | Fitzmaurice et al. |
| 6,870,661 B2 | 3/2005 | Pullen et al. |
| 6,900,851 B2 | 5/2005 | Morrison et al. |
| 6,922,276 B2 | 7/2005 | Zhang et al. |
| 6,950,220 B2 | 9/2005 | Abramson et al. |
| 6,958,848 B2 | 10/2005 | Cao et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,987,603 B2 | 1/2006 | Paolini, Jr. et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates et al. |
| 7,038,655 B2 | 5/2006 | Herb et al. |
| 7,061,663 B2 | 6/2006 | Cao et al. |
| 7,071,913 B2 | 7/2006 | Albert et al. |
| 7,075,502 B1 | 7/2006 | Drzaic et al. |
| 7,075,703 B2 | 7/2006 | O'Neil et al. |
| 7,079,305 B2 | 7/2006 | Paolini, Jr. et al. |
| 7,106,296 B1 | 9/2006 | Jacobson |
| 7,109,968 B2 | 9/2006 | Albert et al. |
| 7,110,163 B2 | 9/2006 | Webber et al. |
| 7,110,164 B2 | 9/2006 | Paolini, Jr. et al. |
| 7,116,318 B2 | 10/2006 | Amundson et al. |
| 7,116,466 B2 | 10/2006 | Whitesides et al. |
| 7,119,759 B2 | 10/2006 | Zehner et al. |
| 7,119,772 B2 | 10/2006 | Amundson et al. |
| 7,148,128 B2 | 12/2006 | Jacobson |
| 7,150,955 B2 * | 12/2006 | Sato et al. .................. 430/156 |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,180,649 B2 | 2/2007 | Morrison et al. |
| 7,190,008 B2 | 3/2007 | Amundson et al. |

| | | | | | | |
|---|---|---|---|---|---|---|
| 7,193,625 B2 | 3/2007 | Danner et al. | | 2006/0181504 A1 | 8/2006 | Kawai |
| 7,202,847 B2 | 4/2007 | Gates | | 2006/0194619 A1 | 8/2006 | Wilcox et al. |
| 7,202,991 B2 | 4/2007 | Zhang et al. | | 2006/0197737 A1 | 9/2006 | Baucom et al. |
| 7,206,119 B2 | 4/2007 | Honeyman et al. | | 2006/0197738 A1 | 9/2006 | Kawai |
| 7,223,672 B2 | 5/2007 | Kazlas et al. | | 2006/0202949 A1 | 9/2006 | Danner et al. |
| 7,230,750 B2 | 6/2007 | Whitesides et al. | | 2006/0209008 A1 | 9/2006 | Nihei et al. |
| 7,230,751 B2 | 6/2007 | Whitesides et al. | | 2006/0214906 A1 | 9/2006 | Kobayashi et al. |
| 7,236,290 B1 | 6/2007 | Zhang et al. | | 2006/0231401 A1 | 10/2006 | Sakurai et al. |
| 7,236,291 B2 | 6/2007 | Kaga et al. | | 2006/0232531 A1 | 10/2006 | Amundson et al. |
| 7,236,292 B2 | 6/2007 | LeCain et al. | | 2006/0238488 A1 | 10/2006 | Nihei et al. |
| 7,242,513 B2 | 7/2007 | Albert et al. | | 2006/0263927 A1 | 11/2006 | Sakurai et al. |
| 7,247,379 B2 | 7/2007 | Pullen et al. | | 2006/0279527 A1 | 12/2006 | Zehner et al. |
| 7,256,766 B2 | 8/2007 | Albert et al. | | 2006/0291034 A1 | 12/2006 | Patry et al. |
| 7,259,744 B2 | 8/2007 | Arango et al. | | 2007/0013683 A1 | 1/2007 | Zhou et al. |
| 7,280,094 B2 | 10/2007 | Albert | | 2007/0035532 A1 | 2/2007 | Amundson et al. |
| 7,304,634 B2 | 12/2007 | Albert et al. | | 2007/0035808 A1 | 2/2007 | Amundson et al. |
| 7,304,787 B2 | 12/2007 | Whitesides et al. | | 2007/0052757 A1 | 3/2007 | Jacobson |
| 7,312,784 B2 | 12/2007 | Baucom et al. | | 2007/0057908 A1 | 3/2007 | Jacobson |
| 7,312,794 B2 | 12/2007 | Zehner et al. | | 2007/0069247 A1 | 3/2007 | Amundson et al. |
| 7,312,916 B2 | 12/2007 | Pullen et al. | | 2007/0085818 A1 | 4/2007 | Amundson et al. |
| 7,321,459 B2 | 1/2008 | Masuda et al. | | 2007/0091417 A1 | 4/2007 | Cao et al. |
| 7,327,511 B2 | 2/2008 | Whitesides et al. | | 2007/0091418 A1 | 4/2007 | Danner et al. |
| 7,339,715 B2 | 3/2008 | Webber et al. | | 2007/0097489 A1 | 5/2007 | Doshi et al. |
| 7,349,148 B2 | 3/2008 | Doshi et al. | | 2007/0103427 A1 | 5/2007 | Zhou et al. |
| 7,352,353 B2 | 4/2008 | Albert et al. | | 2007/0109219 A1 | 5/2007 | Whitesides et al. |
| 7,365,394 B2 | 4/2008 | Denis et al. | | 2007/0146310 A1 | 6/2007 | Paolini et al. |
| 7,365,733 B2 | 4/2008 | Duthaler et al. | | 2007/0152956 A1* | 7/2007 | Danner et al. ............... 345/107 |
| 7,375,875 B2 | 5/2008 | Whitesides et al. | | 2007/0153361 A1 | 7/2007 | Danner et al. |
| 7,382,363 B2 | 6/2008 | Albert et al. | | 2007/0200795 A1 | 8/2007 | Whitesides et al. |
| 7,388,572 B2 | 6/2008 | Duthaler et al. | | 2007/0200874 A1 | 8/2007 | Amundson et al. |
| 7,391,555 B2 | 6/2008 | Albert et al. | | 2007/0211002 A1 | 9/2007 | Zehner et al. |
| 7,411,719 B2 | 8/2008 | Paolini, Jr. et al. | | 2007/0211331 A1 | 9/2007 | Danner et al. |
| 7,411,720 B2 | 8/2008 | Honeyman et al. | | 2007/0223079 A1 | 9/2007 | Honeyman et al. |
| 7,420,549 B2 | 9/2008 | Jacobson et al. | | 2007/0247697 A1 | 10/2007 | Sohn et al. |
| 7,442,587 B2 | 10/2008 | Amundson et al. | | 2007/0285385 A1 | 12/2007 | Albert et al. |
| 7,443,571 B2 | 10/2008 | LeCain et al. | | 2007/0286975 A1 | 12/2007 | Fazel et al. |
| 7,453,445 B2 | 11/2008 | Amundson | | 2008/0013155 A1 | 1/2008 | Honeyman et al. |
| 2002/0060321 A1 | 5/2002 | Kazlas et al. | | 2008/0013156 A1 | 1/2008 | Whitesides et al. |
| 2002/0090980 A1 | 7/2002 | Wilcox et al. | | 2008/0023332 A1 | 1/2008 | Webber et al. |
| 2003/0102858 A1 | 6/2003 | Jacobson et al. | | 2008/0024429 A1 | 1/2008 | Zehner |
| 2004/0105036 A1 | 6/2004 | Danner et al. | | 2008/0024482 A1 | 1/2008 | Gates et al. |
| 2004/0112750 A1 | 6/2004 | Jacobson et al. | | 2008/0030832 A1 | 2/2008 | Paolini, Jr. et al. |
| 2004/0119681 A1 | 6/2004 | Albert et al. | | 2008/0043318 A1 | 2/2008 | Whitesides et al. |
| 2004/0155857 A1 | 8/2004 | Duthaler et al. | | 2008/0048969 A1 | 2/2008 | Whitesides et al. |
| 2004/0180476 A1 | 9/2004 | Kazlas et al. | | 2008/0048970 A1 | 2/2008 | Drzaic et al. |
| 2004/0190114 A1 | 9/2004 | Jacobson et al. | | 2008/0054879 A1 | 3/2008 | LeCain et al. |
| 2004/0263947 A1 | 12/2004 | Drzaic et al. | | 2008/0057252 A1 | 3/2008 | Danner et al. |
| 2005/0001810 A1 | 1/2005 | Yakushiji et al. | | 2008/0074730 A1 | 3/2008 | Cao et al. |
| 2005/0007336 A1 | 1/2005 | Albert et al. | | 2008/0117495 A1 | 5/2008 | Arango et al. |
| 2005/0012980 A1 | 1/2005 | Wilcox et al. | | 2008/0129667 A1 | 6/2008 | Zehner et al. |
| 2005/0018273 A1 | 1/2005 | Honeyman et al. | | 2008/0130092 A1 | 6/2008 | Whitesides et al. |
| 2005/0024353 A1 | 2/2005 | Amundson et al. | | 2008/0136774 A1 | 6/2008 | Harris et al. |
| 2005/0062714 A1 | 3/2005 | Zehner et al. | | 2008/0137176 A1 | 6/2008 | Isobe et al. |
| 2005/0122284 A1 | 6/2005 | Gates et al. | | 2008/0150888 A1 | 6/2008 | Albert et al. |
| 2005/0122306 A1 | 6/2005 | Wilcox et al. | | 2008/0165122 A1 | 7/2008 | Duthaler et al. |
| 2005/0122563 A1 | 6/2005 | Honeyman et al. | | 2008/0174853 A1 | 7/2008 | Danner et al. |
| 2005/0152018 A1 | 7/2005 | Abramson et al. | | 2008/0211764 A1 | 9/2008 | Albert et al. |
| 2005/0156340 A1 | 7/2005 | Valianatos et al. | | 2008/0211765 A1 | 9/2008 | Comiskey et al. |
| 2005/0179642 A1 | 8/2005 | Wilcox et al. | | 2008/0218839 A1 | 9/2008 | Paolini, Jr. et al. |
| 2005/0212747 A1 | 9/2005 | Amundson | | 2008/0254272 A1 | 10/2008 | Danner et al. |
| 2005/0253777 A1 | 11/2005 | Zehner et al. | | 2008/0264791 A1 | 10/2008 | Paolini, Jr. et al. |
| 2005/0259068 A1 | 11/2005 | Nihei et al. | | 2008/0266245 A1 | 10/2008 | Wilcox et al. |
| 2005/0280626 A1 | 12/2005 | Amundson et al. | | 2008/0266646 A1 | 10/2008 | Wilcox et al. |
| 2006/0038772 A1 | 2/2006 | Amundson et al. | | 2008/0291129 A1 | 11/2008 | Harris et al. |
| 2006/0062995 A1 | 3/2006 | Yamamoto | | 2008/0299859 A1 | 12/2008 | Paolini, Jr. et al. |
| 2006/0087479 A1 | 4/2006 | Sakurai et al. | | 2008/0309350 A1 | 12/2008 | Danner et al. |
| 2006/0087489 A1 | 4/2006 | Sakurai et al. | | 2008/0316582 A1 | 12/2008 | Danner et al. |
| 2006/0087718 A1 | 4/2006 | Takagi et al. | | 2009/0000729 A1 | 1/2009 | Danner et al. |
| 2006/0139308 A1 | 6/2006 | Jacobson et al. | | 2009/0004442 A1 | 1/2009 | Danner |
| 2006/0139310 A1 | 6/2006 | Zehner et al. | | | | |
| 2006/0139311 A1 | 6/2006 | Zehner et al. | | | FOREIGN PATENT DOCUMENTS | |
| 2006/0176267 A1 | 8/2006 | Honeyman et al. | | | | |
| 2006/0181492 A1 | 8/2006 | Gates et al. | | EP | 1 145 072 B1 | 5/2003 |

| | | |
|---|---|---|
| JP | 2004-151528 | 5/2004 |
| JP | 2004-258209 | 9/2004 |
| WO | WO 00/36560 | 6/2000 |
| WO | WO 00/38000 | 6/2000 |
| WO | WO 00/67110 | 11/2000 |
| WO | WO 01/07961 | 2/2001 |
| WO | WO 2004/079442 | 9/2004 |

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Bouchard, a. et al., "High-Resolution Microencapsulated Electrophoretic Display on Silicon", SID 04 Digest, 651 (2004).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Gates, H. et al., "A5 Sized Electronic Paper Display for Document Viewing", SID 05 Digest, (2005).

Hayes, R.A., et al., "Video-Speed Electronic Paper Based on Electrowetting", Nature, vol. 425, Sep.25, pp. 383-385 (2003).

Henzen, A. et al., "An Electronic Ink Low Latency Drawing Tablet", SID 04 Digest, 1070 (2004).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Jacobson, J., et al., "The last book", IBM Systems J., 36, 457 (1997).

Jo, G-R, et al., "Toner Display Based on Particle Movements", Chem. Mater, 14, 664 (2002).

Johnson, M. et al., "High Quality Images on Electronic Paper Displays", SID 05 Digest, 1666 (2005).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display", Asia Display/IDW '01, p. 1517, Paper HCS1-1 (2001).

O'Regan, B. et al., "A Low Cost, High-efficiency Solar Cell Based on Dye-sensitized colloidal TiO2 Films", Nature, vol. 353, Oct. 24, 1991, 773-740.

Pitt, M.G., et al., "Power Consumption of Microencapsulated Electrophoretic Displays for Smart Handheld Applications", SID 02 Digest, 1378 (2002).

Webber, R., "Image Stability in Active-Matrix Microencapsulated Electrophoretic Displays", SID 02 Digest, 126 (2002).

Whitesides, T. et al., "Towards Video-rate Microencapsulated Dual-Particle Electrophoretic Displays", SID 04 Digest, 133 (2004).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

* cited by examiner

MULTI-LAYER SHEET FOR USE IN ELECTRO-OPTIC DISPLAYS

REFERENCE TO RELATED APPLICATIONS

This application is a continuation-in-part of copending application Ser. No. 12/017,586, filed Jan. 22, 2008, which itself claims benefit of Application Ser. No. 60/886,005, filed Jan. 22, 2007.

This application is related to:
(a) application Ser. No. 10/249,957, filed May 22, 2003 (now U.S. Pat. No. 6,982,178), which claims benefit of Application Ser. No. 60/319,300, filed Jun. 10, 2002, and Application Ser. No. 60/320,186, filed May 12, 2003;
(b) application Ser. No. 10/907,065, filed Mar. 18, 2005 (now U.S. Pat. No. 7,236,292), which is a divisional of the aforementioned application Ser. No. 10/249,957;
(c) copending application Ser. No. 10/605,024, filed Sep. 2, 2003 (Publication No. 2004/0155857);
(d) application Ser. No. 10/904,063, filed Oct. 21, 2004 (now U.S. Pat. No. 7,110,164), which is a continuation-in-part of the aforementioned application Ser. No. 10/605,024.
(e) copending application Ser. No. 11/550,114, filed Oct. 17, 2006 (Publication No. 2007/0109219);
(f) copending application Ser. No. 11/612,732, filed Dec. 19, 2006 (Publication No. 2007/0152956);
(g) copending application Ser. No. 11/682,409, filed Mar. 6, 2007 (Publication No. 2007/0211331);
(h) copending application Ser. No. 11/850,831, filed Sep. 6, 2007 (Publication No. 2008/0057252);
(i) copending application Ser. No. 11/951,489, filed Dec. 6, 2007;
(j) copending Application Ser. No. 60/946,997, filed Jun. 29, 2007;
(k) copending Application Ser. No. 60/947,001, filed Jun. 29, 2007; and
(l) copending Application Ser. No. 60/947,039, filed Jun. 29, 2007.

The entire contents of these copending applications, and of all other U.S. patents and published and copending applications mentioned below, are herein incorporated by reference. For convenience, the foregoing applications and patents may hereinafter be referred to as the "electro-optic display manufacturing" or "EODM" patents and applications.

BACKGROUND OF INVENTION

This invention relates to multi-layer sheets for use in electro-optic displays. Such electro-optic displays typically contain an electro-optic medium which is a solid (such displays may hereinafter for convenience be referred to as "solid electro-optic displays"), in the sense that the electro-optic medium has solid external surfaces, although the medium may, and often does, have internal liquid- or gas-filled spaces. Thus, the term "solid electro-optic displays" includes encapsulated electrophoretic displays, encapsulated liquid crystal displays, and other types of displays discussed below.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071; 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in copending application Ser. No. 10/711,802, filed Oct. 6, 2004 (Publication No. 2005/0151709), that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Patent Publication Nos. 2005/0259068, 2006/0087479, 2006/0087489, 2006/0087718, 2006/0209008, 2006/0214906, 2006/0231401, 2006/0238488, 2006/0263927 and U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspending medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; 6,639,578; 6,652,075; 6,657,772; 6,664,944; 6,680,725; 6,683,333; 6,704,133; 6,710,540; 6,721,083; 6,724,519; 6,727,881; 6,738,050; 6,750,473; 6,753,999; 6,816,147; 6,819,471; 6,822,782; 6,825,068; 6,825,829; 6,825,970; 6,831,769; 6,839,158; 6,842,167; 6,842,279; 6,842,657; 6,864,875; 6,865,010; 6,866,760; 6,870,661; 6,900,851; 6,922,276; 6,950,200; 6,958,848; 6,967,640; 6,982,178; 6,987,603; 6,995,550; 7,002,728; 7,012,600; 7,012,735; 7,023,420; 7,030,412; 7,030,854; 7,034,783; 7,038,655; 7,061,663; 7,071,913; 7,075,502; 7,075,703; 7,079,305; 7,106,296; 7,109,968; 7,110,163; 7,110,164; 7,116,318; 7,116,466; 7,119,759; 7,119,772; 7,148,128; 7,167,155; 7,170,670; 7,173,752; 7,176,880; 7,180,649; 7,190,008; 7,193,625; 7,202,847; 7,202,991; 7,206,119; 7,223,672; 7,230,750; 7,230,751; 7,236,790; 7,236,792; 7,242,513; 7,247,379; 7,256,766; 7,259,744; 7,280,094; 7,304,634; 7,304,787; 7,312,784; 7,312,794; 7,312,916; 7,237,511; 7,339,715; 7,349,148; 7,352,353; 7,365,394; and 7,365,733; and U.S. Patent Applications Publication Nos. 2002/0060321; 2002/0090980; 2003/0102858; 2003/0151702; 2003/0222315; 2004/0105036; 2004/0112750; 2004/0119681; 2004/0155857; 2004/0180476; 2004/0190114; 2004/0257635; 2004/0263947; 2005/0000813; 2005/0007336; 2005/0012980; 2005/0018273; 2005/0024353; 2005/0062714; 2005/0099672; 2005/0122284; 2005/0122306; 2005/0122563; 2005/0134554; 2005/0151709; 2005/0152018; 2005/0156340; 2005/0179642; 2005/0190137; 2005/0212747; 2005/0253777; 2005/0280626; 2006/0007527; 2006/0038772; 2006/0139308; 2006/0139310; 2006/0139311; 2006/0176267; 2006/0181492; 2006/0181504; 2006/0194619; 2006/0197737; 2006/0197738; 2006/0202949; 2006/0223282; 2006/0232531; 2006/0245038; 2006/0262060; 2006/0279527; 2006/0291034; 2007/0035532; 2007/0035808; 2007/0052757; 2007/0057908; 2007/0069247; 2007/0085818; 2007/0091417; 2007/0091418; 2007/0109219; 2007/0128352; 2007/0146310; 2007/0152956; 2007/0153361; 2007/0200795; 2007/0200874; 2007/0201124; 2007/0207560; 2007/0211002; 2007/0211331; 2007/0223079; 2007/0247697; 2007/0285385; 2007/0286975; 2007/0286975; 2008/0013155; 2008/0013156; 2008/0023332; 2008/0024429; 2008/0024482; 2008/0030832; 2008/0043318; 2008/0048969; 2008/0048970; 2008/0054879; 2008/0057252; and 2008/0074730; and International Applications Publication Nos. WO 00/38000; WO 00/36560; WO 00/67110; and WO 01/07961; and European Patents Nos. 1,099,207 B1; and 1,145,072 B1.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See US Patent Publication No. 2004/0226820); and other similar techniques.) Thus, the resulting display can be flexible. Further, because the display medium can be printed (using a variety of methods), the display itself can be made inexpensively.

Other types of electro-optic media, for example encapsulated liquid crystal media, may also be used in the present invention.

An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

The manufacture of a three-layer electro-optic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive. Similar manufacturing techniques can be used with other types of electro-optic displays. For example, a microcell electrophoretic medium or a rotating bichromal member medium may be laminated to a backplane in substantially the same manner as an encapsulated electrophoretic medium.

As discussed in the aforementioned U.S. Pat. No. 6,982, 178, many of the components used in solid electro-optic displays, and the methods used to manufacture such displays, are derived from technology used in liquid crystal displays (LCD's), which are of course also electro-optic displays, though using a liquid rather than a solid medium. For example, solid electro-optic displays may make use of an active matrix backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with solid electro-optic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to solid electro-optic displays. Because the electro-optic material is solid, it must be present between the backplane and the front electrode before these two integers are secured to each other. Furthermore, in contrast to a liquid crystal material, which is simply placed between the front electrode and the backplane without being attached to either, a solid electro-optic medium normally needs to be secured to both; in some cases the solid electro-optic medium is formed on the front electrode, since this is generally easier than forming the medium on the circuitry-containing backplane, and the front electrode/electro-optic medium combination is then laminated to the backplane, typically by covering the entire surface of the electro-optic medium with an adhesive and laminating under heat, pressure and possibly vacuum.

As discussed in the aforementioned U.S. Pat. No. 6,312, 304, the manufacture of solid electro-optic displays also presents problems in that the optical components (the electro-optic medium) and the electronic components (in the backplane) have differing performance criteria. For example, it is desirable for the optical components to optimize reflectivity, contrast ratio and response time, while it is desirable for the electronic components to optimize conductivity, voltage-current relationship, and capacitance, or to possess memory, logic, or other higher-order electronic device capabilities. Therefore, a process for manufacturing an optical component may not be ideal for manufacturing an electronic component, and vice versa. For example, a process for manufacturing an electronic component can involve processing under high temperatures. The processing temperature can be in the range from about 300° C. to about 600° C. Subjecting many optical components to such high temperatures, however, can be harmful to the optical components by degrading the electro-optic medium chemically or by causing mechanical damage.

This U.S. Pat. No. 6,312,304 describes a method of manufacturing an electro-optic display comprising providing a modulating layer including a first substrate and an electro-optic material provided adjacent the first substrate, the modulating layer being capable of changing a visual state upon application of an electric field; providing a pixel layer comprising a second substrate, a plurality of pixel electrodes provided on a front surface of the second substrate and a plurality of contact pads provided on a rear surface of the second substrate, each pixel electrode being connected to a contact pad through a via extending through the second substrate; providing a circuit layer including a third substrate and at least one circuit element; and laminating the modulating layer, the pixel layer, and the circuit layer to form the electro-optic display.

Electro-optic displays are often costly; for example, the cost of the color LCD found in a portable computer is typically a substantial fraction of the entire cost of the computer. As the use of electro-optic displays spreads to devices, such as cellular telephones and personal digital assistants (PDA's), much less costly than portable computers, there is great pressure to reduce the costs of such displays. The ability to form layers of some solid electro-optic media by printing techniques on flexible substrates, as discussed above, opens up the possibility of reducing the cost of electro-optic components of displays by using mass production techniques such as roll-to-roll coating using commercial equipment used for the production of coated papers, polymeric films and similar media. However, such equipment is costly and the areas of electro-optic media presently sold may be insufficient to justify dedicated equipment, so that it may typically be necessary to transport the coated medium from a commercial coating plant to the plant used for final assembly of electro-optic displays without damage to the relatively fragile layer of electro-optic medium.

Also, most prior art methods for final lamination of electrophoretic displays are essentially batch methods in which the electro-optic medium, the lamination adhesive and the backplane are only brought together immediately prior to final assembly, and it is desirable to provide methods better adapted for mass production.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 µm), preferably about 2 to about 10 mil (51 to 254 µm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

The aforementioned U.S. Pat. No. 6,982,178 also describes a method for testing the electro-optic medium in a front plane laminate prior to incorporation of the front plane laminate into a display. In this testing method, the release sheet is provided with an electrically conductive layer, and a voltage sufficient to change the optical state of the electro-optic medium is applied between this electrically conductive layer and the electrically conductive layer on the opposed side of the electro-optic medium. Observation of the electro-optic medium will then reveal any faults in the medium, thus avoiding laminating faulty electro-optic medium into a display, with the resultant cost of scrapping the entire display, not merely the faulty front plane laminate.

The aforementioned U.S. Pat. No. 6,982,178 also describes a second method for testing the electro-optic medium in a front plane laminate by placing an electrostatic charge on the release sheet, thus forming an image on the electro-optic medium. This image is then observed in the same way as before to detect any faults in the electro-optic medium.

The aforementioned 2004/0155857 describes a so-called "double release film" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

Electro-optic displays manufactured using the aforementioned front plane laminates or double release films normally have a layer of lamination adhesive between the electro-optic layer itself and the backplane, and the presence of this lamination adhesive layer affects the electro-optic characteristics of the displays. In particular, the electrical conductivity of the lamination adhesive layer affects both the low temperature performance and the resolution of the display. The low temperature performance of the display can (it has been found empirically) be improved by increasing the conductivity of the lamination adhesive layer, for example by doping the layer with tetrabutylammonium hexafluorophosphate or other materials as described in the aforementioned U.S. Pat. Nos. 7,012,735 and 7,173,752. However, increasing the conductivity of the lamination adhesive layer in this manner tends to increase pixel blooming (a phenomenon whereby the area of the electro-optic layer which changes optical state in response to change of voltage at a pixel electrode is larger than the pixel electrode itself), and this blooming tends to reduce the resolution of the display. Hence, this type of display apparently intrinsically requires a compromise between low temperature performance and display resolution, and in practice it is usually the low temperature performance which is sacrificed.

The aforementioned 2007/0109219 describes a so-called "inverted front plane laminate", which is a variant of the front plane laminate described in the aforementioned U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane. Such electro-optic displays can combine good resolution with good low temperature performance.

Certain emerging markets for electro-optic displays require displays which are thin, flexible and rollable, such that the display can be repeatedly moved between a stored position wrapped around a mandrel (which may have a diameter of only a few millimeters) and an operating position, in which the display forms a relatively large flat display screen. For example, it has been proposed (see the aforementioned 2006/0194619) to provide a cellular telephone with a flexible display of this type to facilitate the reading of E-mail messages received by the telephone. To provide the size of screen most useful for this purpose, such a flexible display needs to have a thickness not greater than about 0.2 mm.

One major challenge in providing such a thin display is sealing the electro-optic medium against the environment, including radiation. As discussed in several of the aforementioned E Ink patents and applications, some electro-optic media are sensitive to oxygen and moisture, and hence it is necessary that a display using such media incorporate barrier layers to prevent diffusion of oxygen and moisture into (and, in the case of moisture, diffusion out of) the electro-optic medium. It is also desirable to provide a barrier to prevent ultra-violet radiation reaching the electro-optic layer. To provide a display having a commercially acceptable appearance and resistance to mechanical damage, the viewing surface of the display should, at least in some cases, have an anti-glare hard coat. Finally, the portion of the display structure between the electro-optic medium and the viewing surface (hereinafter for convenience referred to as the "front sub-assembly" of the display) needs to provide an electrically-conductive layer which forms the front electrode of the display.

Providing all these functions in a front sub-assembly thin enough to be used in a highly flexible display is a matter of considerable difficulty. While in theory it would be desirable to provide all the necessary functions in a single, monolithic layer, there appears to be no known material capable of providing all these functions in a single layer, and even if such a material could be developed, it would probably be impracticably expensive for use in highly flexible displays. Hence, it is necessary to use a multi-layer front sub-assembly.

Using such a multi-layer front sub-assembly, however, exacerbates another problem in the production of highly flexible displays, namely the difficulty of performing manufacturing operations, including coating, handling, laminating and assembly operations, on very thin substrates due to the lack of stiffness of such substrates. These difficulties can be reduced to some extent by using web processing wherever possible, but final assembly of a highly flexible display requires lamination of a thin sub-assembly comprising the front sub-assembly, the electro-optic medium and (typically) a lamination adhesive layer to a thin backplane, and this lamination normally cannot be performed using web processing.

Another problem in designing highly flexible displays is the phenomenon of "creep". Often it is desired to store a flexible display in a rolled or wrapped configuration (for example, the display may be stored wrapped around a cylindrical mandrel or folded around the outside of a cellular telephone or similar electronic device. When the flexible display is to be used, it unrolled or unwrapped to a substantially planar configuration, then re-rolled or re-wrapped after use. Unless the flexible display is carefully designed, the repeated unrolling or unwrapping of such flexible displays is likely to cause the front and rear substrates normally present to move slightly (creep) relative to one another. Such creep is highly undesirable, since it may result in delamination of various layers of the display from one another, or introduce differences in electro-optic properties between various portions of the display. Creep is a particular problem in color displays using color filters, since any movement between a color filter disposed adjacent the viewing surface of the display and the pixel electrodes present near the rear surface of the display destroys the alignment between the color filter elements and the pixel electrodes needed for accurate color reproduction and thus adversely affects the colors produced by the display.

Hitherto, the front electrodes of electro-optic displays have typically been formed from a sputtered metal oxide ceramic, for example indium tin oxide (ITO). Such sputtered ceramic layers are expensive and can constitute a substantial fraction of the overall cost of the display. Accordingly, it is desirable to replace the sputtered ceramic layer with a continuous or wet coated conducting layer which can reduce cost, but which may also reduce the barrier properties of the front sub-assembly since ITO does itself provide some useful barrier properties. Preferred embodiments of the present invention allow for use of such a continuous or wet coated conducting layer while still maintaining good barrier properties.

The present invention seeks to provide a multi-layer sheet for use as a front sub-assembly in thin, rollable electro-optic displays, this sheet reducing or eliminating at least some of the aforementioned problems. The present invention also seeks to provide a multi-layer sheet which can be used as a barrier layer to be applied over an electro-optic display already provided with a front electrode (and typically with a front substrate supporting this front electrode) in order to improve the sealing of the display.

SUMMARY OF THE INVENTION

As already mentioned, the present invention provides a (first) multi-layer sheet for use as a front sub-assembly in electro-optic displays which are thin and rollable. The present invention also provides a lamination process which can be used to form the multi-layer sheet in a manner which allows each of the individual layers to be optimized to fulfill its function independently of the other layers. The layers can also be produced economically for their particular functions.

Accordingly, this invention provides a (first) multi-layer film useful as a front sub-assembly in electro-optic displays, the multi-layer film comprising, in this order:
 a light-transmissive electrically-conductive layer;
 a light-transmissive first protective layer;
 a light-transmissive moisture barrier layer; and
 a light-transmissive second protective layer.

Such a multi-layer film can be made very thin; typically, a multi-layer film of the present invention will have a total thickness of not more than about 100 µm, and desirably not more than about 50 µm; this total thickness is calculated not including any layer which is removed before the film is incorporated into a functioning electro-optic display. For example, as described in more detail below, it is often desirable to provide the film with a removable masking sheet to facilitate handling of thin sheets involved during production of the multi-layer film, this masking film typically being removed before the film is incorporated into the final electro-optic display, and the thickness of such a masking film is ignored when calculating the total thickness of a multi-layer film of the present invention.

In the first multi-layer film, the light-transmissive electrically-conductive layer comprises indium-tin-oxide or a wet coated conducting layer. Other light-transmissive electrically-conductive layers can of course be used, for example very thin sputtered layers of metals such as aluminum. Since it is often desirable to protect the electro-optic medium present in the final display from too much exposure to ultraviolet radiation, at least one of the first and second protective layers may comprise an ultra-violet absorber. The moisture barrier layer may comprise an aluminum oxide. The film may comprise an anti-glare hard coat on the opposed side of the second protective layer from the light-transmissive electrically-conductive layer. Alternatively or in addition, the film may further comprise a masking film on the opposed side of the second protective layer from the light-transmissive electrically-conductive layer, the masking film being removable from the layer with which it is in contact without substantial damage to said layer; obviously, if both the anti-glare hard coat and the masking film are present, the masking film goes outside the hard coat. The film of the present invention may further comprise an adhesive layer disposed between the first protective layer and the moisture barrier. In some forms of the multi-layer film, to provide addition moisture barrier protection, the moisture barrier may comprise first and second moisture barrier sub-layers separated by a non-barrier intermediate layer. This intermediate layer may be an adhesive layer.

This invention also provides a process for assembling an electro-optic display using a first multi-layer film of the present invention. Such an assembly process can be conducted in several different ways. For example, the multi-layer film can be converted to a front plane laminate in the manner described in the aforementioned U.S. Pat. No. 6,982,178 by coating an electro-optic layer directly on to the light-transmissive electrically-conductive layer of the multi-layer film, separately coating an adhesive layer on to a release sheet and then laminating the two resultant sub-assemblies together by contacting the adhesive layer with the electro-optic layer, typically under heat and pressure to form the front plane laminate. The release sheet can then be peeled from the front plane laminate and the remaining layers laminated to a backplane to form the final display.

However, it is generally preferred to convert the first multi-layer film to an electro-optic display using via an inverted front plane laminate as described in the aforementioned 2007/0109219. Accordingly, this invention provides a process for assembling an electro-optic display comprising:

providing a multi-layer film which itself comprises, in this order:
a light-transmissive electrically-conductive layer;
a light-transmissive first protective layer;
a light-transmissive moisture barrier layer; and
a light-transmissive second protective layer;

providing a double release film comprising a layer of an electro-optic medium sandwiched between first and second adhesive layers;

providing a backplane comprising at least one pixel electrode, laminating the double release film to the multi-layer film with the first adhesive layer contacting the electrically-conductive layer, thus securing the double release film to the multi-layer film; and laminating the double release film to the backplane with the second adhesive layer contacting the backplane, thus securing the double release film to the backplane; in this process, the two laminations may be done in either order.

In this process of the present invention, the multi-layer film may further comprise a masking film on the opposed side of the second protective layer from the light-transmissive electrically-conductive layer, the masking film being removable from the layer with which it is in contact without substantial damage to this layer, the masking film being removed from this layer after the multi-layer film has been secured to the double release film. In this process, the multi-layer film typically has a total thickness of not more than about 50 µm, not including any layer which is removed before the film is incorporated into a functioning electro-optic display, and the total thickness of the laminated multi-layer film, double release film and backplane typically does not exceed about 150 µm.

This invention also provides two processes for forming preferred multi-layer films of the present invention. The first of these two processes comprises: providing a first polymeric sheet comprising an ultra-violet absorber and having a light-transmissive electrically-conductive layer on one surface thereof, providing a second polymeric sheet having a moisture barrier on one surface thereof, coating an adhesive layer on to either the moisture barrier coated surface of the second polymeric sheet or the surface of the first polymeric sheet which does not carry the electrically-conductive layer; and contacting the first and second polymeric sheets together leaving the electrically-conductive layer exposed and with the adhesive layer and the moisture barrier disposed between the two polymeric sheets. The process may further comprise providing an anti-glare hard coat on the surface of the second polymeric sheet remote from the moisture barrier.

The second of these two processes comprises: providing first and second polymeric sheets each comprising a polymeric layer having a moisture barrier on one surface thereof; coating an adhesive layer over one of the moisture barriers; contacting the first and second polymeric sheets together with the adhesive layer and the two moisture barriers disposed between the two polymeric layers; introducing an ultraviolet absorber into one of the polymeric layers; and forming a conductive layer on an exposed surface of one of the polymeric layers.

This invention also provides a (second) multi-layer film useful as a barrier film in electro-optic displays, the multi-layer film comprising, in this order:
a light-transmissive adhesive layer;
a light-transmissive first protective layer;
a light-transmissive first moisture barrier layer;
an intermediate layer;
a light-transmissive second moisture barrier layer; and
a light-transmissive second protective layer.

Like the first multi-layer film of the present invention described above, the second multi-layer film can be made very thin; typically, a second multi-layer film of the present invention will have a total thickness of not more than about 100 µm, and desirably not more than about 75 µm; this total thickness is calculated not including any layer which is removed before the film is incorporated into a functioning electro-optic display. For example, it may often be desirable to provide the film with a removable masking sheet to facilitate handling of thin sheets involved during production of the multi-layer film, this masking film typically being removed before the film is incorporated into the final electro-optic display, and the thickness of such a masking film is ignored when calculating the total thickness of the second multi-layer film.

Since it is often desirable to protect the electro-optic medium present in the final display from too much exposure to ultra-violet radiation, at least one of the first and second protective layers may comprise an ultra-violet absorber. To provide addition moisture barrier protection, the second film of the present invention comprises first and second moisture barrier layers separated by a non-barrier intermediate layer, which for reasons explained below will often be an adhesive layer. Each of the moisture barrier layers may comprise an aluminum oxide. The film may comprise an anti-glare hard coat on the opposed side of the second protective layer from the barrier layers. Alternatively or in addition, the film may further comprise a masking film on the opposed side of the second protective layer from the barrier layers, the masking film being removable from the layer with which it is in contact without substantial damage to said layer; obviously, if both the anti-glare hard coat and the masking film are present, the masking film goes outside the hard coat. The adhesive layer of the film may, and typically is, covered by a release sheet.

This invention also provides a process for assembling an electro-optic display using a first multi-layer film of the present invention. Such an assembly process can be conducted in several different ways. For example, the multi-layer film can be converted to a front plane laminate in the manner described in the aforementioned U.S. Pat. No. 6,982,178 by coating an electro-optic layer directly on to the light-transmissive electrically-conductive layer of the multi-layer film, separately coating an adhesive layer on to a release sheet and then laminating the two resultant sub-assemblies together by contacting the adhesive layer with the electro-optic layer, typically under heat and pressure to form the front plane laminate. The release sheet can then be peeled from the front plane laminate and the remaining layers laminated to a backplane to form the final display.

This invention also provides a process for assembling an electro-optic display using a second multi-layer film of the present invention. Such an assembly process can be conducted in several different ways. For example, the multi-layer film could be adhered to a front plane laminate (comprising a light-transmissive electrically conductive layer and (typically) a front substrate) to produce a composite front sub-assembly which can thereafter be laminated, in the same way as a conventional front plane laminate, to a backplane. However, more commonly, a front plane laminate will be laminated to a backplane, and the second multi-layer film of the present invention will thereafter be laminated to the front (viewing) surface of the resultant display. In many cases where the front plane laminate is thin, it may be advantageous to adhere the front plane laminate to a masking film which is removed after the front plane laminate has been laminated to the backplane and before the multi-layer film is laminated to the display.

Also, as described below with reference to FIG. 4, in many very thin displays diffusion of moisture and other environmental materials through the backplane into the electro-optic medium is a significant problem, and thus additional barrier protection is needed on the backplane side of the display. Conveniently, a second multi-layer film of the present invention may be placed on the backplane side of the display to provide such additional barrier protection.

DETAILED DESCRIPTION

The accompanying drawings are not strictly to scale. In particular, for ease of illustration, the thicknesses of the various layers are greatly exaggerated relative to their lateral dimensions. The present invention is well adapted for the production of thin, flexible electro-optic displays; typically, the multi-layer sheets described below will have thicknesses (measured without the masking film, which is discarded before the final display is used) of not more than about 100 µm, and preferably not more than about 75 µm, and the sheets can be laminated to flexible backplanes of similar thickness. It has been found that the thin, first multi-layer films (hereinafter for convenience called "front sub-assembly films") of the present invention, when used with thin electro-optic media and backplanes, are effective in reducing creep. The second multi-layer films (hereinafter for convenience called "barrier films") of the present invention, when used with thin electro-optic media and backplanes, are effective in preventing ingress of moisture and other environmental contaminants into electro-optic media.

Figure 1:
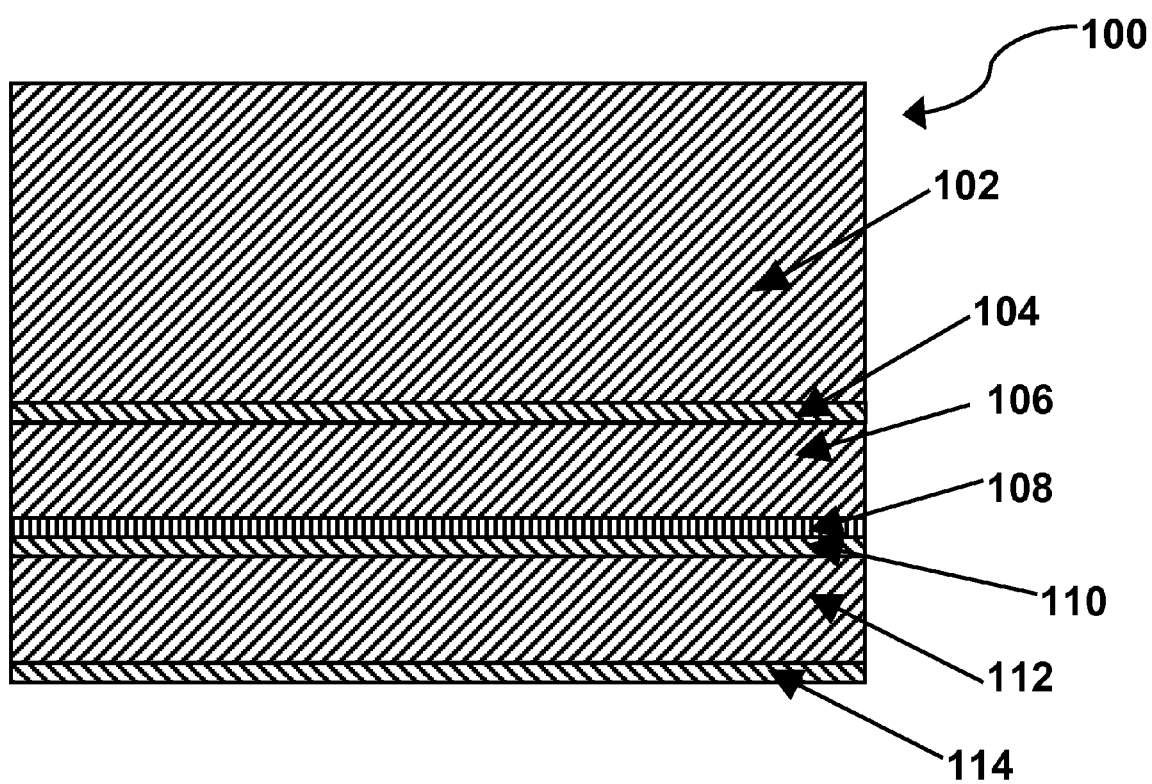
FIG. 1 is a schematic cross-section through a first embodiment of the first multi-layer film of the present invention.

FIG. 1 of the accompanying drawings is a schematic cross-section through a first front sub-assembly film or sheet (generally designated 100) of the present invention. The sheet 100 comprises a masking film 102 having a thickness of approximately 2 mil (51 µm), and an anti-glare hard coat 104 in contact with the masking film 102. The masking film 102, which is removed before the final display is used, and may be removed before the sheet 100 is laminated to a flexible backplane (not shown) to form the final display, serves to protect the hard coat 104 from damage during production of the sheet 100. The masking film 102 also serves to increase the thickness and stiffness of the sheet 100, thereby facilitating handling thereof.

The sheet 100 further comprises a 0.5 mil (13 µm) poly (ethylene terephthalate) (PET) layer 106, which carries, on its surface remote from the hard coat 104, an aluminum oxide (AlO$_x$) barrier layer 108. The barrier layer 108 is in contact with a thin (approximately 5 µm) cured adhesive layer 110, which secures the barrier layer 108 to a second 0.5 mil (13 µm) PET layer 112. Unlike the PET layer 106, the PET 112 contains an ultra-violet absorber. Finally, the sheet 100 comprises an ITO layer 114, which acts as a barrier layer and also forms the front electrode of the final display. Accordingly, the ITO layer 114 is present on one external surface of the sheet 100 so that it can lie as close as possible to the electro-optic medium. In contrast, the structure of the sheet 100 places the AlO$_x$ layer 108 in the middle of the stack of layers, between the two PET layers 106 and 112. This placement of the thin AlO$_x$ layer 108 reduces the chance of mechanical damage to this barrier layer.

The preferred process for manufacturing the sheet 100 shown in FIG. 1 is as follows. An ultra-violet absorber is incorporated into a PET sheet 112 and on to one surface of the resultant UV-absorbing PET layer is sputtered an ITO layer 114. Separately, AlO$_x$ is sputtered on to a second PET sheet 106. A curable wet adhesive 110 is coated either on to the AlO$_x$-coated surface of the second PET sheet 106 or on to the non-ITO coated surface of the first PET sheet 112, and the two PET sheets are secured together to form a sub-assembly comprising layers 106-114 in FIG. 1. Finally, the anti-glare hard coat 104 is coated on to the exposed surface of the PET layer 106 and the masking film 102 (which is supplied as a preformed film, typically in roll form) is applied to the exposed surface of the hard coat 104 to increase the handling thickness of the sheet 100 and to protect the hard coat 104.

The total thickness of the sheet 100 (without the removable masking film 102) can be less than 50 µm. As already indicated, the two PET layers 106 and 112 are each 0.5 mil thick, so their total thickness is 1 mil or 25 µm. The adhesive layer 110 is about 5 µm thick. The anti-glare hard coat 105 will typically have a thickness of 2 µm or less. The sputtered barrier layer 108 and ITO layer 114 each have a thickness of the order of about 1 µm. Accordingly, the total thickness of the sheet 100 will be about 34 µm. Manipulating sheets of this thickness during conventional roll-to-roll operations poses considerable difficulties and hence a relatively thick masking sheet 102, typically having a thickness of about 50 µm, is desirable to provide a sheet with a thickness which reduces the difficulties of coating on conventional web processing equipment.

The ability to provide all necessary barrier, ultra-violet protection and hard coat (mechanical protection and anti-glare) functions in a single sheet of this thickness enables the production of much thinner electro-optic displays than is typically possible in prior art designs, in which the various functions of the sheet 100 are provided by separate layers. As already noted, the sheet 100 may have a thickness of about 34 µm. A typically double release film might comprise a 25 µm electrophoretic layer sandwiched between a 25 µm adhesive layer (which is laminated to the sheet 100) and a 6 µm adhesive layer (which is laminated to the backplane), for a total thickness of about 56 µm (not including the release films which are of course removed before the double release film is incorporated into the final display). By printing organic semiconductors on a polymeric film, it is possible to produce backplanes having a total thickness, even including any additional barrier layers needed, not greater than about 25 µm. An electro-optic display produced from the sheet 100 and such a double release film and backplane would have a total thickness of about 115 µm, and physical characteristics not very different from commercial 5 mil (127 µm) PET film. Such a display could thus readily be wrapped around a mandrel (say) 10 mm in diameter, or wrapped around a cellular telephone or similar electronic device of similar thickness.

Numerous variations of the structure shown in FIG. 1 are possible. The masking film 102 can be omitted if desired. In some applications, it may also be possible to omit the hard coat 104, leaving one surface of the PET layer 106 as the viewing surface of the sheet 100. Depending upon the sensitivity of the particular electro-optic medium used to ultra-violet radiation, and possibly the intended use of the display (for example, a rollable display intended for use as a display screen in an indoor lecture theater may not need ultra-violet protection), the ultra-violet absorber can be omitted from PET layer 112, or ultra-violet absorption can be provided in other ways, as described in the aforementioned 2007/0109219. The $AlO_x$ barrier layer can be replaced by any sputtered or evaporated metal or ceramic layer or polymer having sufficient transparency and barrier properties; examples of appropriate materials may include ITO, aluminum, silicon oxide, silicon carbide, and the homopolymers sold commercially under the Registered Trade Marks CLARIS, ACLAR and SARAN. Similarly, the ITO layer 114 can be replaced by any sputtered or evaporated metal or ceramic layer or polymer having sufficient transparency and conductivity; examples of appropriate materials may include aluminum, a conductive polymer such as PEDOT (poly(3,4-ethylenedioxythiophene)), and carbon nanotubes.

The combination of the $AlO_x$ layer 108 and the ITO layer 114 provides a more effective barrier layer than either layer alone. The barrier properties of sputtered films are limited by small pinholes inevitably present in the sputtered layer. By laminating two sputtered films together, as is done in the manufacture of the sheet 100 as described above, a redundant barrier layer is formed in which superposition of randomly distributed pinholes in the two barrier layers is highly unlikely.

The sheet 100 is also mechanically durable. Mechanical stress tends to cause cracks in $AlO_x$ and ITO barrier layers, but the presence of the redundant barrier layers and the fact that these barrier layers are applied to different polymeric (PET) films separated by a thin adhesive layer tends to decouple the occurrence of cracks in the two barrier layers from each other. A sheet 100 as shown in FIG. 1 (with or without the masking film 102) has been rolled 10,000 time around a 15 mm diameter mandrel without showing any decrease in barrier properties relative to the sheet prior to any rolling.

Although the discussion above has been primarily directed to very thin front sub-assemblies having thicknesses of the order of 25 µm, additional impact protection can be added by increasing the thickness of the sub-assembly. This can be effected by increasing the thickness of one or both of the PET layers, laminating additional layers (for example of PET, PEN or polycarbonate), or providing thicker auxiliary layers, such as the adhesive and barrier layers.

It might at first glance appear that an essentially monolithic, non-laminated sheet having properties similar to those of the sheet 100 could be produced by sputtering the two barrier layers on the opposed sides of a single polymeric layer, with an ultra-violet absorber being provided either within the polymeric layer or as an additional coating over the non-electrode barrier layer (i.e., the $AlO_x$ layer in sheet 100), coating the anti-glare hard coat and applying a masking film if desired. However, such a process has the serious disadvantage that, since the sputtering and coating steps are carried out sequentially on the same polymeric layer, the yield loss at the various steps are compounded, which is likely to render the resulting sheet expensive. Furthermore, defects in the polymeric layer that nucleate locally poor barrier properties are likely to affect barrier layers on both sides of the same polymeric layer, so that the barrier properties may well be compromised. Similarly, cracks due to mechanical stress are likely to occur at the same location in both barrier layers.

Figure 2:
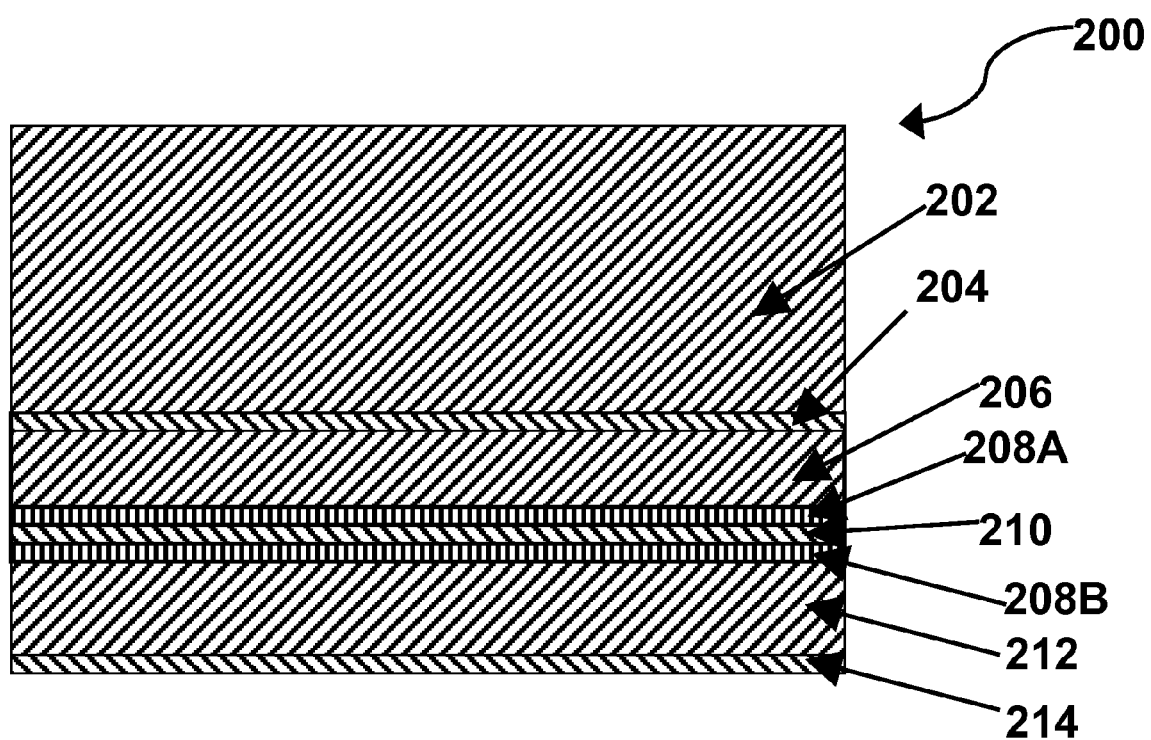
FIG. 2 is a schematic cross-section through a second embodiment of the first multi-layer film of the present invention.

FIG. 2 of the accompanying drawings is a schematic cross-section through a second multi-layer sheet (generally designated 200) of the present invention. The sheet 200 comprises a masking film 202 having a thickness of approximately 2 mil (51 µm), and an anti-glare hard coat 204 in contact with the masking film 202. Both the masking film 202 and the hard coat 204 are identical to the corresponding layers of the sheet 100 shown in FIG. 1 and serve the same functions. The sheet 200 further comprises a 0.5 mil (13 µm) poly(ethylene terephthalate) (PET) layer 206; however, in sheet 200, it is this layer 206 which carries the ultra-violet absorber. The surface of layer 206 remote from the hard coat 204 carries an $AlO_x$ barrier layer 208A, which is secured by a thin (approximately 5 µm) cured adhesive layer 210 to a second $AlO_x$ barrier layer 208B. Barrier layer 208B is carried on a second 0.5 mil (13 µm) PET layer 212. Finally, the sheet 200 comprises a wet coated conducting layer 214, which forms the front electrode of the final display.

The preferred process for manufacturing the sheet 200 shown in FIG. 2 is as follows. The process starts from two sheets of PET which already have an $AlO_x$ layer formed thereon; such PET sheets bearing $AlO_x$ coatings are readily available commercially, and the two sheets will eventually form the layers 206/208A and 212/208B of the final sheet 200. A curable wet adhesive is coated on to one of the $AlO_x$ coatings, and the two PET/$AlO_x$ sheets are brought together and the adhesive cured to form the layers 206/208A/210/208B/212 of the sheet 200. Ultra-violet absorber is diffused into the PET layer 206, and the conducting layer 214 is wet coated on to one surface of the second PET sheet 212. Finally, the anti-glare hard coat 204 is coated on to the exposed surface of the PET layer 206 and the masking film 202 is then applied to the exposed surface of the hard coat 204.

It will be noted that in sheet 200 both the $AlO_x$ barrier layers 208A and 208B are buried between the two PET layers and are thus well protected from mechanical damage.

As with the sheet 100 shown in FIG. 1, numerous variations of the sheet 200 shown in FIG. 2 are possible. All the variations mentioned for the sheet 100 can also be effected in the sheet 200. In addition, the ultra-violet absorber can be incorporated in either PET layer The masking film 202 can be omitted if desired. In some applications, it may also be possible to omit the hard coat 204, leaving one surface of the PET layer 206 as the viewing surface of the sheet 200. Depending upon the sensitivity of the particular electro-optic medium used to ultra-violet radiation, and possibly the intended use of the display, the ultra-violet absorber can be omitted from PET layer 206, or ultra-violet absorption can be provided in other ways, as described in the aforementioned 2007/0109219. The $AlO_x$ barrier layer can be replaced by any sputtered or evaporated metal or ceramic layer or polymer having sufficient transparency and barrier properties; examples of appropriate materials may include ITO, aluminum, silicon oxide, silicon carbide, and the homopolymers sold commercially under the Registered Trade Marks CLARIS, ACLAR and SARAN. Similarly, the conductive layer 216 can be replaced by any sputtered or evaporated metal or ceramic layer or polymer having sufficient transparency and conductivity; examples of appropriate materials may include aluminum, a conductive polymer such as PEDOT (poly(3,4-ethylenedioxythiophene)), and carbon nanotubes. In the sheet 200, the order of assembly is important to reduce yield loss.

As noted above, in the sheet 100 shown in FIG. 1 the ITO layer 114 serves both conductive and barrier functions. In contrast, wet processed conductive layers such as the layer 216 in sheet 200 typically have poor barrier properties. Accordingly, in order to preserve excellent barrier properties, the sheet 200 is provided with two $AlO_x$ layers 208A and 208B (in contrast to the single $AlO_x$ layer 108 in sheet 100) to provide barrier properties similar to those provided by the combination of the $AlO_x$ layer 108 and the ITO layer 114 in sheet 100. Providing two $AlO_x$ layers 208A and 208B in sheet 200 is economically feasible since an $AlO_x$ coated polymer film is relatively inexpensive, whereas ITO is expensive. The mechanical properties of sheet 200 are very similar to those of film 100.

From the foregoing, it will be seen that the present invention can provide a mechanically robust front sub-assembly with excellent barrier properties for use in an electro-optic display. Features such as an anti-glare hard coat, ultra-violet absorber, thickness and type of masking film employed (if any) can readily be varied to suit individual customer requirements.

Figure 3:
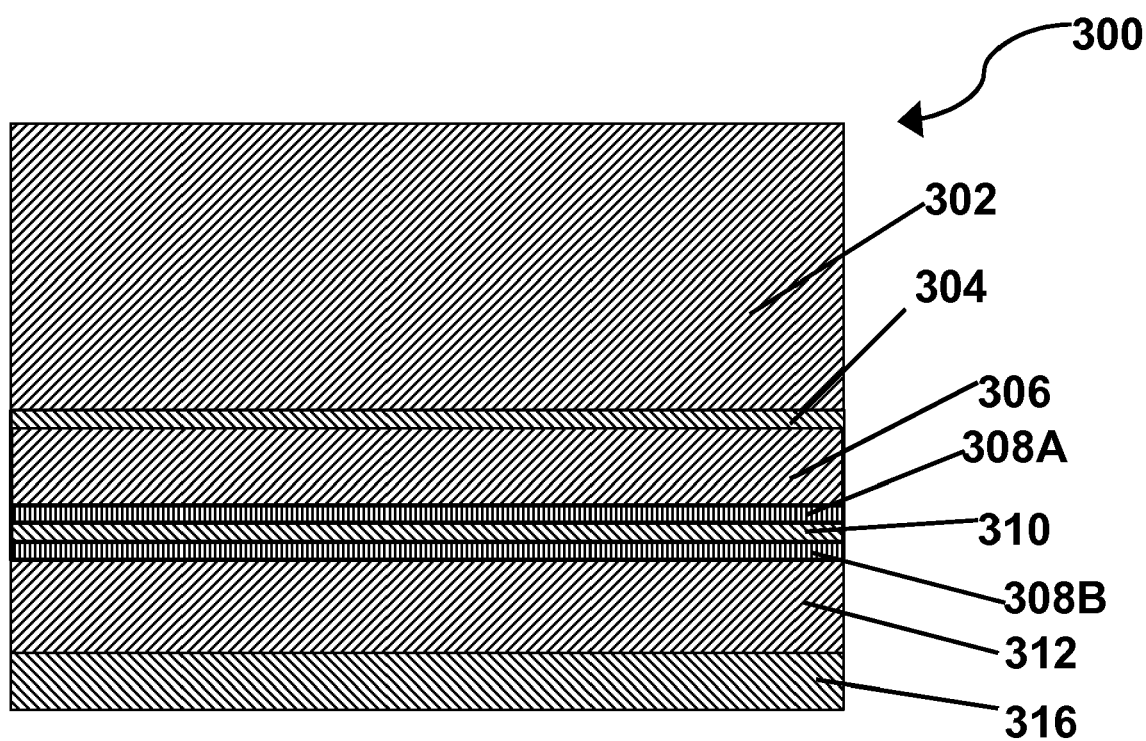
FIG. 3 is a schematic cross-section through a first embodiment of the second multi-layer film of the present invention.

FIG. 3 of the accompanying drawings is a schematic cross-section, similar to that of FIGS. 1 and 2, through a barrier film (generally designated 300) of the present invention. The barrier film shown in FIG. 3 is very similar to the front sub-assembly film 200 shown in FIG. 2 (and the various layers are numbered in a corresponding manner), except that the ITO layer 214 present in the sub-assembly film 200 is replaced by an adhesive layer 316, which is used to secure the barrier film 300 to the front substrate of an electro-optic display, as described in detail below with reference to FIG. 4. Although not shown in FIG. 3, the adhesive layer 316 may be covered by a release sheet. Also, in barrier film 300 the ultra-violet absorber is present in the PET layer 312 rather than in the PET layer 306, although alternatively the absorber could be present in either or both of the PET layers.

The barrier film 300 is prepared in a manner very similar to the film 200 shown in FIG. 2. The process starts from two sheets of PET which already have an $AlO_x$ layer formed thereon; such PET sheets bearing $AlO_x$ coatings are readily available commercially, and the two sheets will eventually form the layers 306/308A and 312/308B of the final sheet 300. A curable wet adhesive is coated on to one of the $AlO_x$ coatings, and the two PET/$AlO_x$ sheets are brought together and the adhesive cured to form the layers 306/308A/310/308B/312 of the sheet 300. Ultra-violet absorber is diffused into the PET layer 312, and the adhesive layer 316 is coated on to one surface of the second PET sheet 312, and if desired covered by a release sheet. Finally, the anti-glare hard coat 304 is coated on to the exposed surface of the PET layer 306 and the masking film 302 is then applied to the exposed surface of the hard coat 204.

As with the sheets 100 and 200 previously described, numerous variations of the barrier film 300 shown in FIG. 3 are possible. As already mentioned, the ultra-violet absorber can be incorporated in either PET layer The masking film 302 can be omitted if desired. In some applications, it may also be possible to omit the hard coat 304, leaving one surface of the PET layer 306 as the viewing surface of the film 300. Depending upon the sensitivity of the particular electro-optic medium used to ultra-violet radiation, and possibly the intended use of the display, the ultra-violet absorber can be omitted from PET layer 312, or ultra-violet absorption can be provided in other ways, as described in the aforementioned 2007/0109219. The $AlO_x$ barrier layer can be replaced by any sputtered or evaporated metal or ceramic layer or polymer having sufficient transparency and barrier properties; examples of appropriate materials may include ITO, aluminum, silicon oxide, silicon carbide, and the homopolymers sold commercially under the Registered Trade Marks CLARIS, ACLAR and SARAN.

Figure 4:
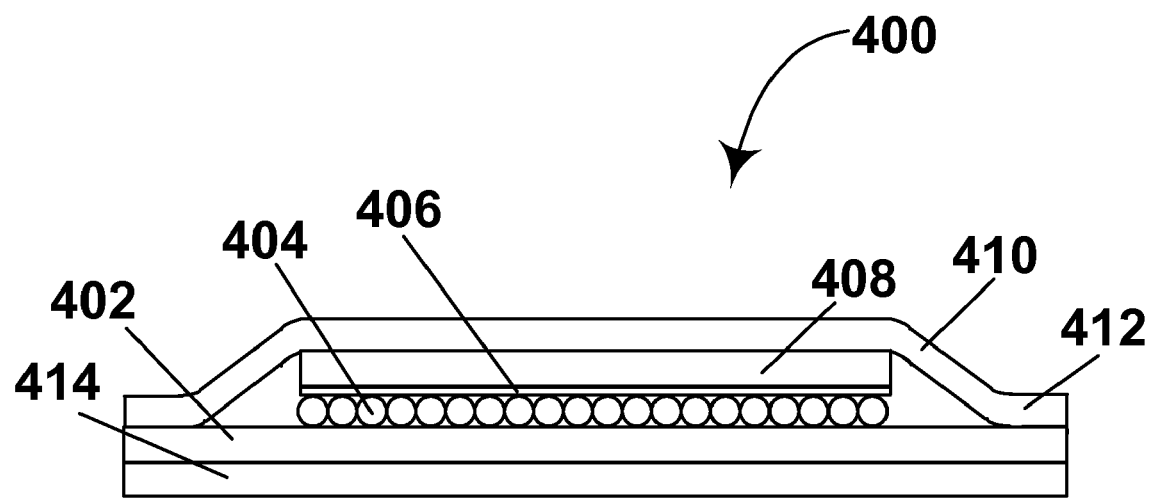
FIG. 4 is a schematic cross-section showing two of the multi-layer films as illustrated in FIG. 3 being used to provide barrier protection to an electro-optic display.

FIG. 4 is a schematic cross-section through an electrophoretic display (generally designated 400) protected by two barrier films of the type shown in FIG. 3. The display 400 comprises a backplane 402 provided with pixel electrodes (not shown), a layer of an encapsulated electrophoretic medium 404, a front electrode 406 and a front substrate 408. A front barrier film 410 (which can be identical to the film 300 shown in FIG. 3) extends over the front substrate 408 and is adhered thereto by the adhesive layer (not shown separately in FIG. 4) of the film 410.

The backplane 402 is made larger in both dimensions that the electrophoretic layer 404, front electrode 406 and front substrate 408 so that a peripheral area of the backplane is exposed free from the electrophoretic layer 404, front electrode 406 and front substrate 408. The film 410 is of substantially the same size as the backplane 402 so that a peripheral portion of the film 410 is adhered to the peripheral area of the backplane, as indicated at 412.

As mentioned above, when a thin backplane is used in an electro-optic display, diffusion of moisture and other environmental contaminants through the backplane into the electro-optic medium can become a significant problem. To reduce this problem in the display 400, a rear barrier film 416 (which can be identical to the film 300 shown in FIG. 3) is provided covering the surface of the backplane 402 remote from the electrophoretic layer 404.

It will be apparent from the preceding discussion that the films of the present invention can be used with any electro-optic layer which has a solid external surface to which the film can adhere. Accordingly, the present methods can be carried out using any of the types of electro-optic media described above. For example, the present methods can make use of rotating bichromal member, electrochromic or electrophoretic media, and in the last case the electrophoretic media may be of the encapsulated, polymer-dispersed or microcell types. Displays produced using the films of the present invention may be used in any application in which prior art solid electro-optic displays have been used. Thus, for example, the present displays may be used in electronic book readers, portable computers, tablet computers, cellular telephones, smart cards, signs, watches, shelf labels and flash drives.

Numerous changes and modifications can be made in the preferred embodiments of the present invention already described without departing from the scope of the invention. For example, the present invention may be useful with non-electrophoretic electro-optic media which exhibit behavior similar to electrophoretic media. Accordingly, the foregoing description is to be construed in an illustrative and not in a limitative sense.

The invention claimed is:

1. A multi-layer film useful as a barrier film in electro-optic displays, the multi-layer film comprising, in this order:
   a light-transmissive adhesive layer;
   a light-transmissive first protective layer;
   a light-transmissive first moisture barrier layer;
   an intermediate layer;
   a light-transmissive second moisture barrier layer; and
   a light-transmissive second protective layer.

2. A film according to claim 1 having a total thickness of not more than about 100 μm, not including any layer which is removed before the film is incorporated into a functioning electro-optic display.

3. A film according to claim 2 having a total thickness of not more than about 75 μm, not including any layer which is removed before the film is incorporated into a functioning electro-optic display.

4. A film according to claim 1 wherein at least one of the first and second protective layers comprises an ultra-violet absorber.

5. A film according to claim 1 wherein at least one of the moisture barrier layers comprises an aluminum oxide.

6. A film according to claim 1 wherein the intermediate layer comprises an adhesive layer.

7. A film according to claim 1 further comprising an anti-glare hard coat on the opposed side of the second protective layer from the barrier layers.

8. A film according to claim 1 further comprising a masking film on the opposed side of the second protective layer from the barrier layers, the masking film being removable from the layer with which it is in contact without substantial damage to said layer.

9. A film according to claim 1 further comprising a release sheet covering the light-transmissive adhesive layer.

10. A film according to claim 1 wherein the moisture barrier comprises first and second moisture barrier sub-layers separated by a non-barrier intermediate layer.

11. A process for assembling an electro-optic display comprising:
    providing a multi-layer film which itself comprises, in this order:
        a light-transmissive adhesive layer;
        a light-transmissive first protective layer;
        a light-transmissive first moisture barrier layer;
        an intermediate layer;
        a light-transmissive second moisture barrier layer; and
        a light-transmissive second protective layer;
    providing an electro-optic display comprising, in this order;
        a backplane comprising at least one pixel electrode;
        a layer of an electro-optic medium;
        a light-transmissive electrically-conductive layer; and
        a front substrate;
    laminating the multi-layer film to the display with the adhesive layer of the multi-layer film contacting the front substrate of the display, thus securing the multi-layer film to the multi-layer film to the display.

12. A process according to claim 11 wherein the multi-layer film further comprises a masking film on the opposed side of the second protective layer from the barrier layers, the masking film being removable from the layer with which it is in contact without substantial damage to said layer, and wherein the masking film is removed from said layer after the multi-layer film has been secured to the display.

13. A process according to claim 11 wherein the multi-layer film has a total thickness of not more than about 75 μm, not including any layer which is removed before the film is incorporated into the display.

14. A process according to claim 11 wherein the backplane is larger than the layer of electro-optic medium, light-transmissive electrically-conductive layer, and front substrate so as the leave a peripheral area of the backplane exposed clear of the layer of electro-optic medium, light-transmissive electrically-conductive layer, and front substrate, and wherein a peripheral portion of the multi-layer film is laminated to the peripheral area of the backplane.

15. A process according to claim 11 further comprising providing a second multi-layer film as defined in claim 11 and laminating the second multi-layer film to the surface of the backplane remote from the layer of electro-optic medium.

16. A process according to claim 11 in which the multi-layer film further comprises a release sheet covering the adhesive layer, and the process further comprises peeling the release sheet from the adhesive layer prior to contacting the adhesive layer with the front substrate of the display.

17. A process for preparing a multi-layer film useful as a barrier film in electro-optic displays, the process comprising:
    providing first and second sheet each comprising a protective layer and a moisture barrier layer;
    coating a first adhesive layer on to one of the moisture barrier layers;
    contacting the first and second sheets together so that the first adhesive layer contacts the moisture barrier layer on the other sheet; and
    coating a second adhesive layer on the surface of one of the protective layers remote from the first adhesive layer.

18. A process according to claim 17 further comprising providing an anti-glare hard coat on the exposed surface of the protective layer not bearing the second adhesive layer.

19. A process according to claim 17 further comprising incorporating an ultra-violet absorber into at least one of the protective layers.

* * * * *